(12) United States Patent
Conboy et al.

(10) Patent No.: US 6,666,337 B1
(45) Date of Patent: Dec. 23, 2003

(54) METHOD AND APPARATUS FOR DETERMINING WAFER IDENTITY AND ORIENTATION

(75) Inventors: Michael R. Conboy, Austin, TX (US); Sam H. Allen, Jr., New Braunfels, TX (US); Elfido Coss, Jr., Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 143 days.

(21) Appl. No.: 09/782,843

(22) Filed: Feb. 14, 2001

(51) Int. Cl.$^7$ .......................... B07C 5/00; H01L 23/544
(52) U.S. Cl. ............... 209/546; 257/618; 257/E23.179; 438/401; 438/462
(58) Field of Search .................... 209/546, 611, 209/612; 257/618, 620, E23.179; 438/401, 459, 462

(56) References Cited

U.S. PATENT DOCUMENTS

| | | | | |
|---|---|---|---|---|
| 5,153,507 A | * | 10/1992 | Fong et al. ............ | 324/158 R |
| 5,702,538 A | * | 12/1997 | Endros et al. ........... | 257/64 X |
| 5,702,984 A | * | 12/1997 | Bertin et al. ........... | 257/686 X |
| 5,991,699 A | * | 11/1999 | Kulkarni et al. ......... | 438/10 X |
| 6,268,641 B1 | * | 7/2001 | Yano et al. ............. | 257/620 |

\* cited by examiner

*Primary Examiner*—Tuan N. Nguyen
(74) *Attorney, Agent, or Firm*—Williams, Morgan & Amerson, P.C.

(57) ABSTRACT

A system for identifying wafers contained in a wafer carrier includes a wafer sorter. Each wafer includes a surface terminating in an edge and a plurality of sector identification codes disposed on the surface proximate the edge. The wafer sorter is adapted to scan at least a portion of a wafer extending from the carrier and to identify at least one of the sector identification codes on the wafer independent of the orientation of the wafer in the wafer carrier. A method for identifying wafers contained in a wafer carrier is provided. Each wafer includes a surface terminating in an edge and a plurality of sector identification codes disposed on the surface proximate the edge. The method includes scanning at least a portion of a wafer extending from the carrier and identifying at least one of the sector identification codes on the wafer independent of the orientation of the wafer in the wafer carrier.

21 Claims, 5 Drawing Sheets

METHOD AND APPARATUS FOR DETERMINING WAFER IDENTITY AND ORIENTATION

BACKGROUND OF THE INVENTION

1. Field of the Invention

This invention relates generally to the field of semiconductor device manufacturing and, more particularly, to a method and apparatus for determining wafer identity and orientation using circumscribed wafer identification marks with unique sector descriptors.

2. Description of the Related Art

During the manufacture of semiconductor devices, semiconductor wafers, each including a plurality of individual die, are subjected to a number of processing steps. Typically, wafers are grouped into lots that are processed together. Each lot may contain, for example, 25 individual wafers. As a lot of wafers progresses through the processing line, the wafers are typically housed in a carrier.

FIG. 1 illustrates a typical semiconductor wafer 10. The wafer 10 includes an orientation notch 20 useful as a reference point for orienting the wafer 10. Some of the processes performed on the wafer 10 (e.g., photolithography) are highly sensitive to wafer orientation. Typically, prior to performing an orientation-sensitive process the wafer is rotated until the notch 20 is located and placed in a predetermined position. For identification purposes, a unique wafer identification code 30 is scribed on the wafer 10 beneath the notch 20 using a laser scribing process where small dots are burned into the surface to construct the characters or symbols of the code. Exemplary wafer identification codes 30 may include alphanumeric identifiers or bar code identifiers (e.g., 1 or 2 dimensional codes). During the production process, process history and metrology information is stored in a database for each of the wafers 10 indexed by its respective wafer identification code 30.

When a lot of wafers 10 is housed in a carrier, only a portion of the periphery of each wafer 10 is visible. If the visible portion includes the notch 20, an optical wafer sorter may read the wafer identification code 30 to discern the identities of the wafer 10. However, if the visible portion does not include the notch 20, the wafer 10 must first be rotated before its identity can be determined. Rotating the wafer 10 sometimes requires that it first be removed from the carrier. The necessity to orient the wafers 10 prior to determining their identities reduces the efficiency of the identification process, and thus, the efficiency of the processing line. Wafer handling also increases the likelihood of damage (e.g., droppage, scratching, cracking, etc.), particulate contamination, and loss or traceability.

Another problem associated with the wafer identification code 30 is that it tends to become harder to read as the wafer 10 progresses through the manufacturing process. Wafers 10 are subjected to a wide variety of processes, such as chemical and physical etching, polishing, annealing, that have a tendency to degrade the wafer identification code 30. In some cases the degradation in the wafer identification code 30 is sufficiently severe that it can no longer be read by the wafer sorter. One technique for countering the degradation is the use of self correcting coding techniques, such as two dimensional bar coding, that encode redundant information in horizontal and vertical patterns. If a portion of the pattern is obscured, the missing information may sometimes be recreated from the redundant information. Even with such information redundancy, some wafer identification codes 30 may still degrade to the point where they are unreadable.

The present invention is directed to overcoming, or at least reducing the effects of, one or more of the problems set forth above.

SUMMARY OF THE INVENTION

One aspect of the present invention is seen in a system for identifying wafers contained in a wafer carrier. Each wafer includes a surface terminating in an edge and a plurality of sector identification codes disposed on the surface proximate the edge. A wafer sorter is adapted to scan at least a portion of a wafer extending from the carrier and to identify at least one of the sector identification codes on the wafer independent of the orientation of the wafer in the wafer carrier.

Another aspect of the present invention is seen in a method for identifying wafers contained in a wafer carrier. Each wafer includes a surface terminating in an edge and a plurality of sector identification codes disposed on the surface proximate the edge. The method includes scanning at least a portion of a wafer extending from the carrier and identifying at least one of the sector identification codes on the wafer independent of the orientation of the wafer in the wafer carrier.

BRIEF DESCRIPTION OF THE DRAWINGS

The invention may be understood by reference to the following description taken in conjunction with the accompanying drawings, in which like reference numerals identify like elements, and in which.

Figure 1:
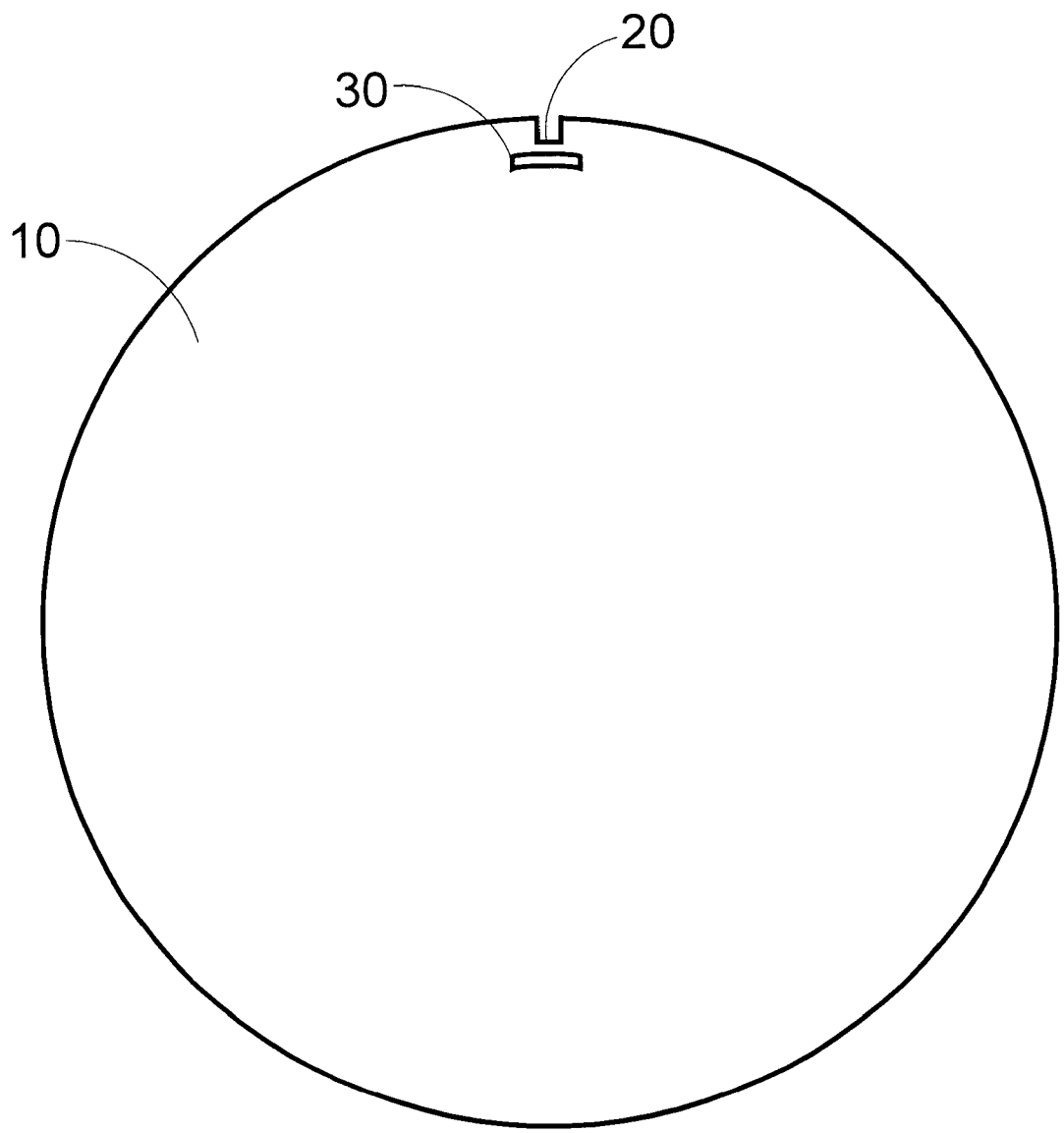
FIG. 1 is a simplified diagram of a prior art semiconductor wafer including an orientation notch and a wafer identification code.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
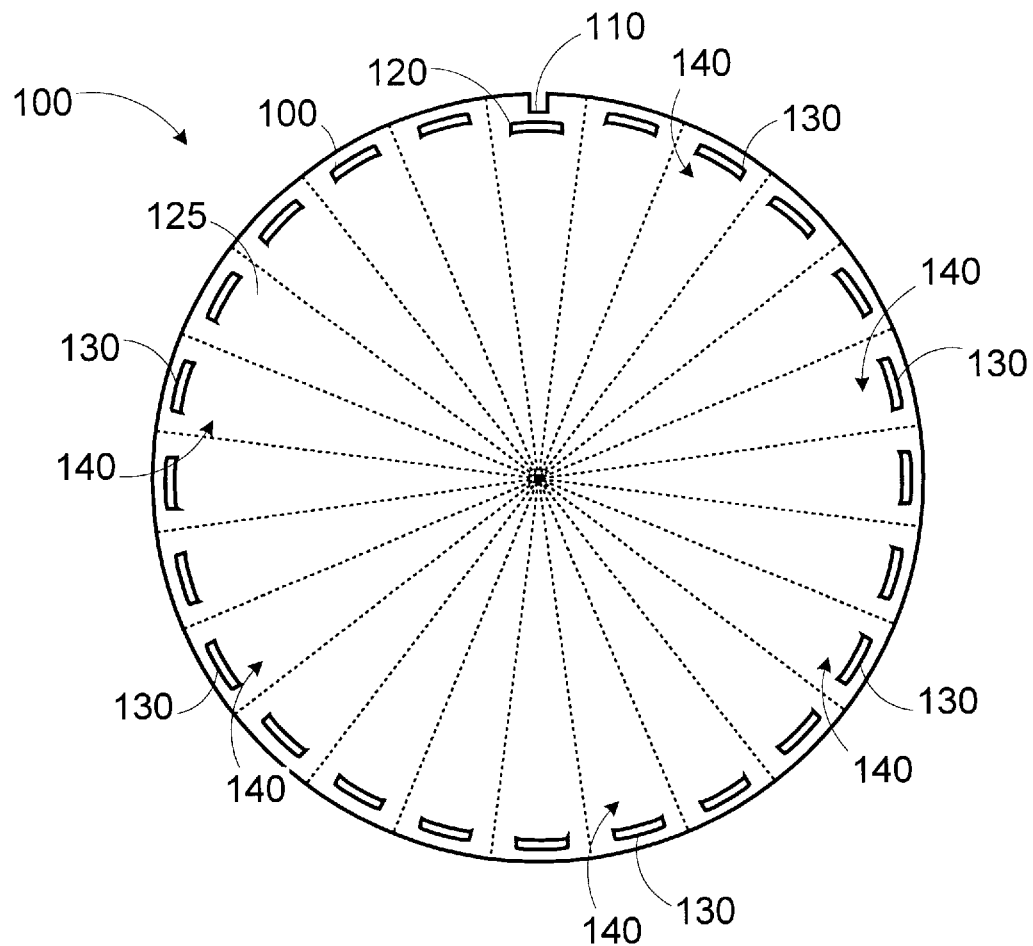
FIG. 2 is a simplified diagram of a semiconductor wafer having circumscribed sector identification codes in accordance with one illustrative embodiment of the present invention.

Turning now to FIG. 2, a simplified diagram of a semiconductor wafer 100 identified in accordance with one illustrative embodiment of the present invention is provided. The wafer 100 includes an orientation notch 110 and a wafer identification code 120 scribed on a surface 125 of the wafer 100. The orientation notch 110 and wafer identification code 120 may be used by a conventional wafer sorter (not shown) to orient and identify the wafer 100 as described above in reference to FIG. 1. The wafer 100 also includes sector identification codes 130 circumscribed about the periphery of the wafer 100. Each sector identification code 130 is associated with a particular sector 140 of the wafer 100. In the illustrated embodiment, the sector identification codes 130 are nearer the edge of the wafer 100 than the wafer identification code 120 to reduce the amount of space they consume on the wafer 100. The sector identification codes 130 are used to determine the identify of the wafer 100 and the orientation if the wafer 100 within a wafer carrier without requiring rotation or removal of the wafer 100.

Figure 3:
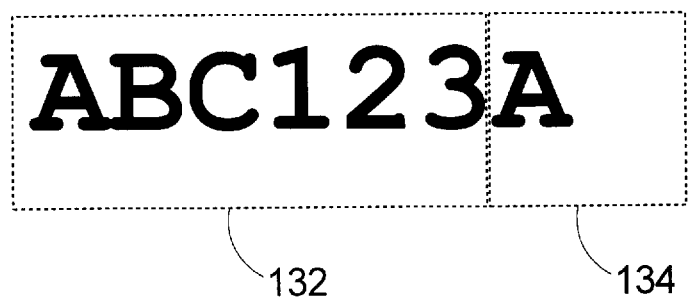
FIG. 3 is a diagram of an exemplary sector identification code used on the wafer of FIG. 2.

Referring briefly to FIG. 3, a diagram of an exemplary sector identification code 130 is provided. The sector identification code 130 is an alphanumeric code that includes a wafer descriptor 132 and a sector descriptor 134. Other code formats, such as one or two dimensional bar codes, may be used. The wafer identification code 120 may have the same wafer descriptors 132 as the sector identification codes. The sector descriptor 134 may be omitted or set to a default value (e.g., 0). The particular number of sectors 140 and associated sector identification codes 130 defined on the wafer 100 in an actual implementation may vary based on factors such as the size of the wafer, the arc length of the wafer normally visible for identification, and the desired accuracy of the identification and orientation determinations.

Figure 4:
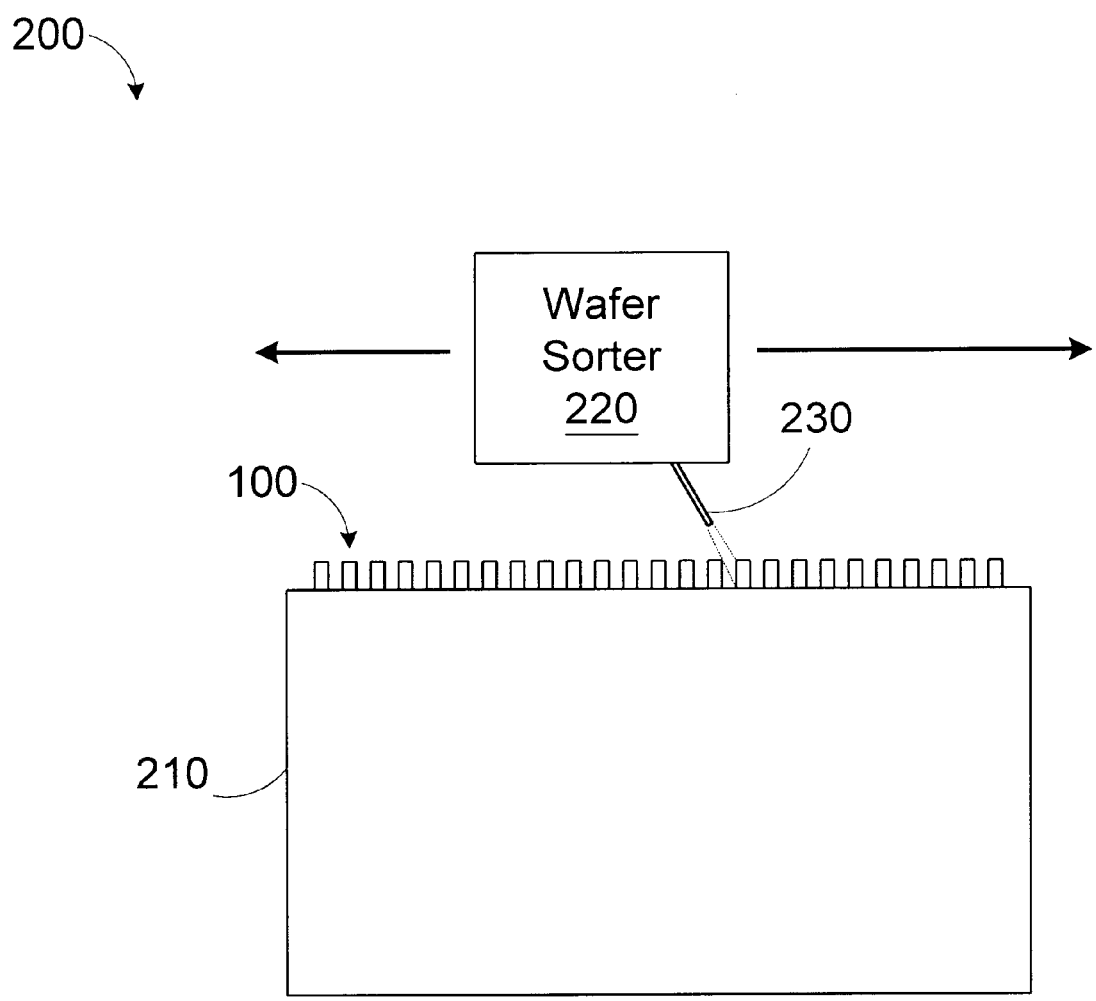
FIG. 4 is a simplified diagram of a wafer sorting system used to identify the wafer of FIG. 2.
Figure 5:
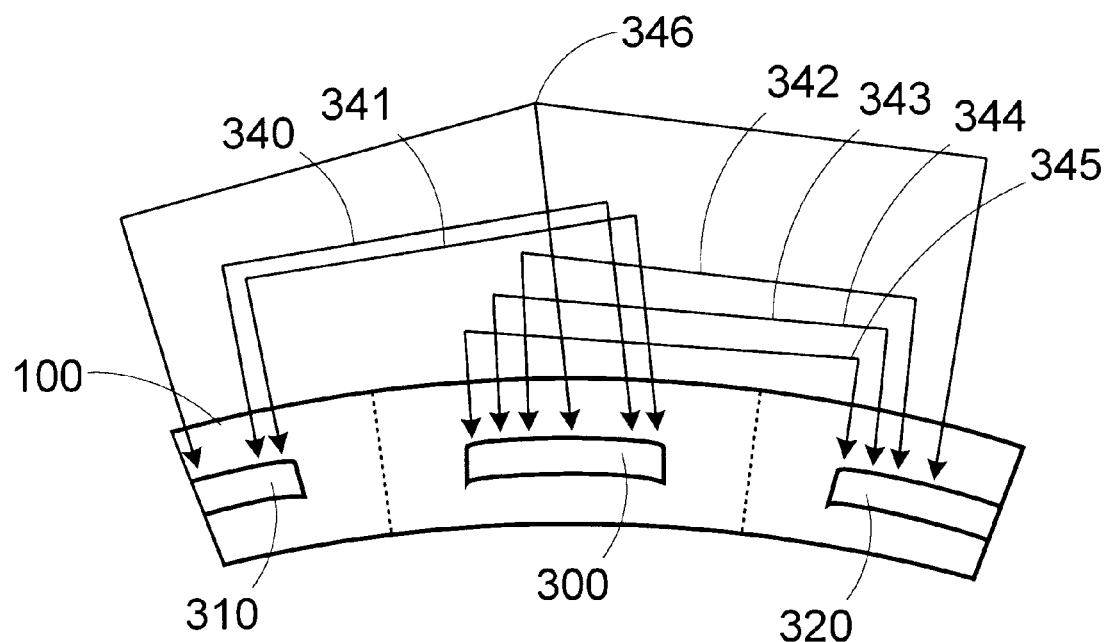
FIG. 5 depicts a portion of the wafer of FIG. 2 to illustrate how adjacent circumscribed wafer identification marks may be correlated to identify the wafer.

Turning now to FIG. 4, a simplified diagram of a wafer sorting system 200 used to identify the wafer 100 is provided. A wafer carrier 210 holds a lot of wafers 100. A wafer sorter 220 having an optical sensor 230 passes over the wafers 100 to read the identification codes 130, 140 that are visible. Exemplary wafer sorters 220 suitable for reading the identification codes 130, 140 are an APS2000 wafer sorter offered by Brooks Automation/Irvine Optical and a CSMT wafer sorter offered by Kensington Laboratories, Inc. The arc length of the wafer 100 that is visible depends on the dimensions of the wafer carrier 210 and the wafers 100 (e.g., size of opening in carrier 210, wafer diameter, wafer spacing, sensor angle, etc.). Typically, the arc length of the wafer 100 that is visible while the wafer 100 is housed in the carrier 210 is between about 30° and 45°. Depending on the orientation of each wafer 100, one or more sector identification codes 130 and possibly the wafer identification code 120 may be visible. FIG. 5 depicts a portion of the wafer 100 that is visible to the wafer sorter 220.

Based on the orientation of the wafer 100 in the wafer carrier 210, the sensor 230 is able to identify one full sector identification code 300 and two partial sector identification codes 310, 320. In one embodiment, the wafer sorter 220 identifies which of the visible codes 300, 310, 320 is complete and reads the code to determine the identity of the wafer 100.

In another embodiment, the wafer sorter 220 uses a correlation technique to improve the accuracy of the identity determination. Because redundant information is contained in the partial sector identification codes 310, 320, the images of the individual codes may be overlayed to generate a composite image of the wafer descriptor 132. A correlation may be performed on the entire code, or individually on each character of the wafer descriptor 132. FIG. 5 illustrates a correlation technique that performs an individual analysis of each character in the wafer descriptor 132 (see FIG. 3). Each correlation location is represented by an arrow 340–346. Note that the correlation sites 340–345 are suitable for a two-way correlation, while the correlation site 346 is suitable for a three-way correlation. Generally, if more redundant information can be included in the correlation, the accuracy is increased. Specific techniques for performing image correlations are well known to those of the art, and for clarity and ease of illustration they are not described in greater detail herein. In general, the light intensities for each pixel of each image are combined to create a composite image. If a portion of one of the sector identification codes 130 is damaged by processing, the images of the other codes used in the correlation may be used to reconstruct the damaged code.

Figure 6:
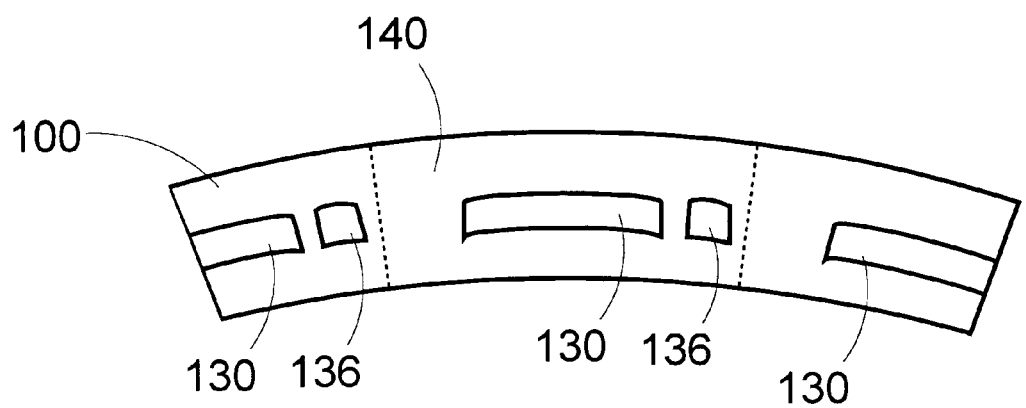
FIG. 6 depicts a portion of the wafer of FIG. 2 to illustrate how additional wafer identification marks may be added assign a new identification code to a reclaimed wafer.

In some instances, a wafer 100 that has been misprocessed may be reclaimed. Because the reclaimed wafer 100 is subjected to a different process flow than the original wafer the first time it was processed, it is assigned a new identity. FIG. 6 is a diagram of a reclaimed wafer 400. Typically, the sectors 140 defined on the wafer are sized such that blank space remains between adjacent sector identification codes 130. On the reclaimed wafer 400, a reclamation descriptor 136 is scribed in the space between the sector identification codes 130. The wafer sorter 220 appends the reclamation descriptor 136 to the wafer descriptor 132 (shown in FIG. 3) to identify the reclaimed wafer 400. The correlation techniques described above may also be applied to the reclamation descriptors 136 for enhancing the accuracy of the identification process.

Figure 7:
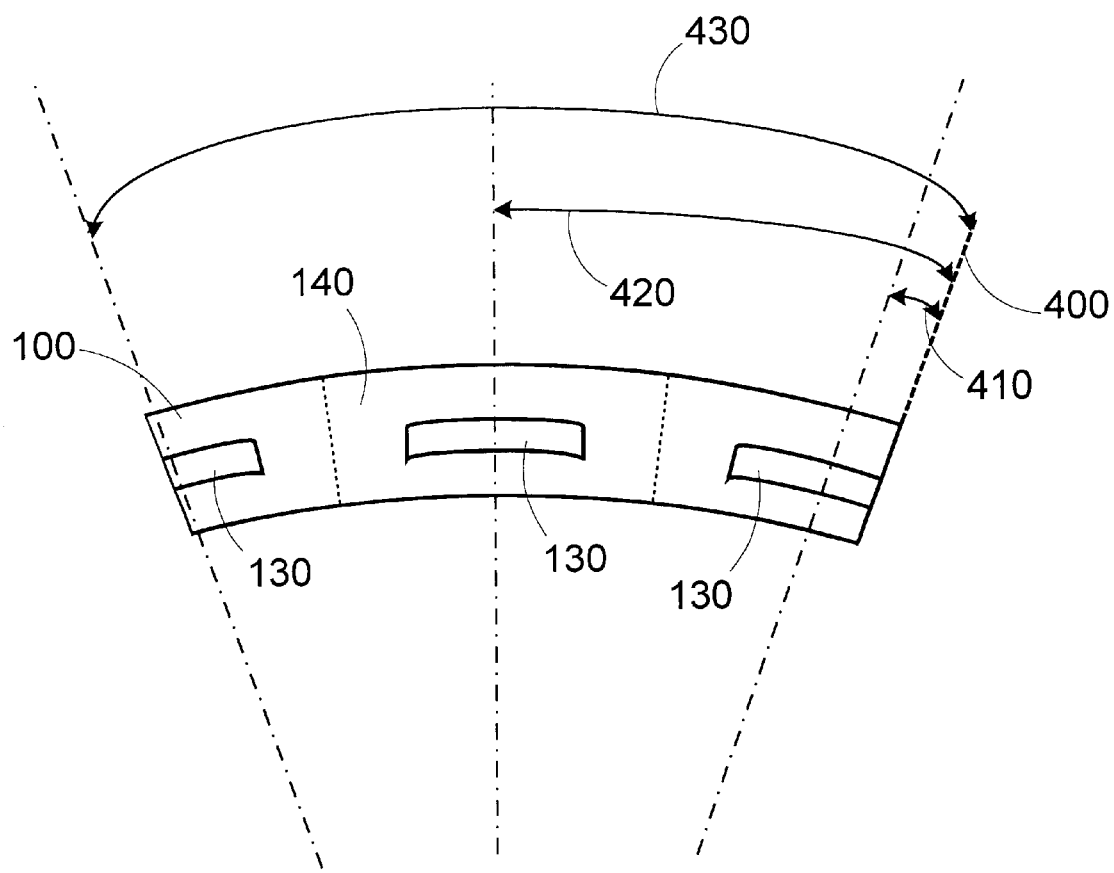
FIG. 7 depicts a portion of the wafer of FIG. 2 to illustrate how adjacent circumscribed wafer identification marks may be used in conjunction to determine the orientation of the wafer.

Referring to FIG. 7, a portion of the wafer of FIG. 2 is shown to illustrate how the wafer sorter 220 may determine the orientation of the wafer 100 in the wafer carrier 210. When the sector identification codes 130 are scribed on the wafer 100, their positions relative to the center of the notch 110 (see FIG. 2) are tightly controlled. In the illustrated embodiment, each sector identification code 130 is located a specified distance from the edge of the wafer 100 and spaced at increments of 15° from the center of the notch 110. The particular angle will vary depending on the number of sectors 140 used. Based on the sector descriptor 134 (see FIG. 3), the wafer sorter 220 can determine how far the particular sector identification code 130 is displaced from the notch 110. A reference point for each of the sector identification codes 130 (e.g., center of code) may be compared to a reference point 400 on the wafer carrier to calculate offset angles 410, 420, 430. Each offset angle 410, 420, 430 may be combined with the knowledge of the angle the associated sectors 140 to determine an independent measurement of the orientation of the wafer 100 within the wafer carrier 210 (i.e., location of the notch relative to the reference point 400). The independent orientation measurements may be compared and/or combined (e.g., averaged) to increase the accuracy of the orientation estimate.

Knowledge of the orientation of the wafer 100 within the carrier 210 is useful for certain processing steps where the orientation of the wafer 100 within a processing tool used to manufacture devices on the wafer 100 is controlled. One such use is described in U.S. patent application Ser. No. 09/521,046, entitled, "WAFER ROTATION IN SEMICONDUCTOR PROCESSING," and incorporated herein by reference in its entirety. Because the orientation of the wafer 100 is known prior to being inserted into the tool, it can easily be placed in the proper orientation in the processing tool without first having to be removed from the carrier 210 and rotated to a known position.

Using sector identification codes 130 scribed on the periphery of the wafer 100, as described herein, has numerous advantages. First the identity of each of the wafers can be determined using an optical scan technique while the wafers 100 are still housed in the wafer carrier 210. This arrangement significantly reduces the time required to identify the wafers 100, thus improving the efficiency of the wafer processing line. Second, because multiple sector identification codes 130 may be read to generate redundant identification data that may be correlated, a wafer that has experienced degradation in one or more of the sector identification codes 130 may still be identified. Third, the orientation of the wafers 100 within the wafer carrier 210 may also be determined based on the sector identification codes 130. Fourth, because the sector identification codes 130 are used to identify the wafer, the need for wafer handling is reduced, resulting in a reduced likelihood for particle contamination or handling damage.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
   a semiconductor wafer having a surface terminating in an edge, wherein a plurality of sectors are defined on the wafer; and
   plurality of sector identification codes disposed on the surface proximate the edge, each sector having an associated sector identification code.

2. The apparatus of claim 1, wherein each sector identification code includes a wafer descriptor and a sector descriptor.

3. The apparatus of claim 1, wherein each sector is equally sized.

4. The apparatus of claim 1, further comprising a plurality of reclamation descriptors disposed proximate the sector identification codes.

5. The apparatus of claim 1, further comprising a notch defined in the wafer proximate the edge.

6. The apparatus of claim 5, wherein the placement of each sector identification code is defined by an integer multiple of a predetermined angular offset form the notch.

7. The apparatus of claim 5, further comprising a wafer identification code disposed on the surface proximate the notch.

8. The apparatus of claim 7, wherein each sector identification code includes a wafer descriptor and a sector descriptor, and the wafer identification code includes at least the wafer descriptor.

9. The apparatus of claim 1, wherein the sector identification codes comprise at least one of a bar code and an alphanumeric code.

10. A method for identifying wafers contained in a wafer carrier, each wafer including a surface terminating in an edge and a plurality of sector identification codes disposed on the surface proximate the edge, the method comprising:
    scanning at least a portion of a wafer extending from the carrier; and
    identifying at least one of the sector identification codes on the wafer independent of the orientation of the wafer in the wafer carrier.

11. The method of claim 10, further comprising identifying a wafer descriptor and a sector descriptor in the sector identification code.

12. The method of claim 10, further comprising identifying a reclamation descriptor in the sector identification code.

13. The method of claim 10, wherein a notch is defined in each wafer proximate the edge, and identifying at least one of the sector identification codes comprises identifying the at least one of the sector identification codes on the wafer independent of the orientation of the notch in the wafer carrier.

14. The method of claim 10, wherein a plurality of sectors are defined on the wafer, each sector has an associated sector identification code, the placement of each sector identification code is defined by an integer multiple of a predetermined angular offset from the notch, and the method further comprises determining an orientation of the wafer in the wafer carrier based on the sector identification code.

15. The method of claim 14, wherein determining the orientation comprises comparing a position of the sector identification code to a reference position on the wafer carrier.

16. The method of claim 15, wherein a notch is defined in each wafer proximate the edge, and determining the orientation further comprises determining an angular offset between the notch and the sector identification code based on a sector descriptor in the sector identification code.

17. The method of claim 16, wherein determining the orientation comprises determining the orientation of the wafer in the wafer carrier based on the angular offset and the position of the sector identification code relative to the reference position on the wafer carrier.

18. The method of claim 10, wherein a notch is defined in each wafer proximate the edge, a wafer identification code is disposed on the surface proximate the notch, and the method further comprises identifying the wafer identification code.

19. The method of claim 18, further comprising identifying a wafer descriptor in the wafer identification code.

20. The method of claim 10, wherein identifying the at least one of the sector identification codes comprises:
    identifying at least two partial sector identification codes; and
    correlating the at least two partial sector identification codes to generate the at least one sector identification code.

21. A system for identifying wafers contained in a wafer carrier, each wafer including a surface terminating in an edge and a plurality of sector identification codes disposed on the surface proximate the edge, the system comprising:
    means for scanning at least a portion of a wafer extending from the carrier; and
    means for identifying at least one of the sector identification codes on the wafer independent of the orientation of the wafer in the wafer carrier.

* * * * *